United States Patent
Bireckoven et al.

Patent Number: 5,780,877
Date of Patent: Jul. 14, 1998

[54] BREAK-OVER PHOTODIODE

[75] Inventors: Bernd Bireckoven, Kusterdingen; Dirk Hoheisel; Ning Qu, both of Reutlingen, all of Germany

[73] Assignee: Robert Bosch GmbH, Stuttgart, Germany

[21] Appl. No.: 795,624

[22] Filed: Feb. 6, 1997

[30] Foreign Application Priority Data

Feb. 10, 1996 [DE] Germany ............... 196 04 890.7

[51] Int. Cl.$^6$ ..................................... H01L 29/74
[52] U.S. Cl. ................. 257/113; 257/114; 257/144; 257/153; 257/462
[58] Field of Search ..................... 257/113, 115, 257/118, 136, 144, 153, 257, 462, 114

[56] References Cited

U.S. PATENT DOCUMENTS 4,587,546  5/1986  Herberg ................... 257/113

FOREIGN PATENT DOCUMENTS 44 17 164  6/1995  Germany ................... 257/113

*Primary Examiner*—Minh-Loan Tran
*Attorney, Agent, or Firm*—Kenyon & Kenyon

[57] ABSTRACT

A break-over photodiode, designed as a light-sensitive thyristor, can be stacked using a series connection with a plurality of break-over photodiodes, such stacking representing a high-voltage break-over diode. The break-over photodiode can be triggered by lateral illumination in an edge zone, and includes a gate-layer resistivity under the emitter which is greater in an edge zone of the break-over photodiode than in the central zone of the break-over photodiode. The light sensitivity of the laterally illuminatable break-over photodiode is increased by a greater gate-layer resistivity in the edge zone as compared to the central zone.

10 Claims, 2 Drawing Sheets

BREAK-OVER PHOTODIODE

FIELD OF THE INVENTION

The present invention relates to a break-over photodiode.

BACKGROUND INFORMATION

German Patent No. 44 17 164 describes a break-over photodiode that can be stacked with a plurality of additional break-over photodiodes. This stack represents a light-sensitive high-voltage switch. Each break-over photodiode of this stack has a light-sensitive region illuminated by light-emitting elements so that at a predefined time, for example, in an ignition voltage distributor of a car at the time of the ignition of the cylinder pertaining to the light-sensitive high-voltage switch, the break-over photodiode switches through. With the disclosed design of the individual break-over photodiodes, light sensitivity to lateral illumination is a critical parameter, as is the minimum required light flux for triggering the break-over photodiode, which should be reduced. Furthermore, it is desirable to ensure that the break-over photodiode, in particular a stack of break-over photodiodes, will not switch through in an undesirable manner as a result of parasitic or displacement currents.

SUMMARY OF THE INVENTION

The arrangement according to the present invention has the advantage of an increased light sensitivity in an edge region that can be laterally illuminated. Thus, the break-over photodiode can be triggered through lateral illumination even when voltages that are low in comparison to the break-over voltage are applied.

By selecting the thickness of an n⁻layer in an appropriate manner, a higher current amplification can be achieved within the break-over photodiode than at its edges. This has proven to be advantageous for a homogeneous current distribution when the break-over photodiode switches through. Thus, a concentration of higher currents in the edge region of the break-over photodiode due to the high field intensities prevailing there can be counteracted.

It is further advantageous to dimension an edge-gate-cathode resistivity formed by a p region located between the n⁻region and the edge emitter so that a break-over of the break-over photodiode occurs without the central region being illuminated. The break-over photodiode has a high break-over current in such case, which protects the diode from unintentional switching due to parasitic currents and/or cut-off currents. Such advantage is particularly important in the case of small chip surfaces or when no other methods for protecting the break-over photodiode from undesired switching are available.

Designing a rand emitter located in the edge region with a greater thickness than that of an emitter located in the central area and/or selecting the doping profile of the edge emitters and internal emitter in an appropriate manner is a simple way of making an edge-gate-cathode resistivity greater than a center-gate-cathode resistivity located in the central area.

In order to design the edge-gate-cathode resistivity to be greater than the center-gate-cathode resistivity, the gate can be dimensioned appropriately in the edge region or the central region. This provides another advantage of a larger effective base width of an npn partial transistor in the edge region, and prevents the current from being excessively amplified in the edge-region.

DETAILED DESCRIPTION

Figure 1:
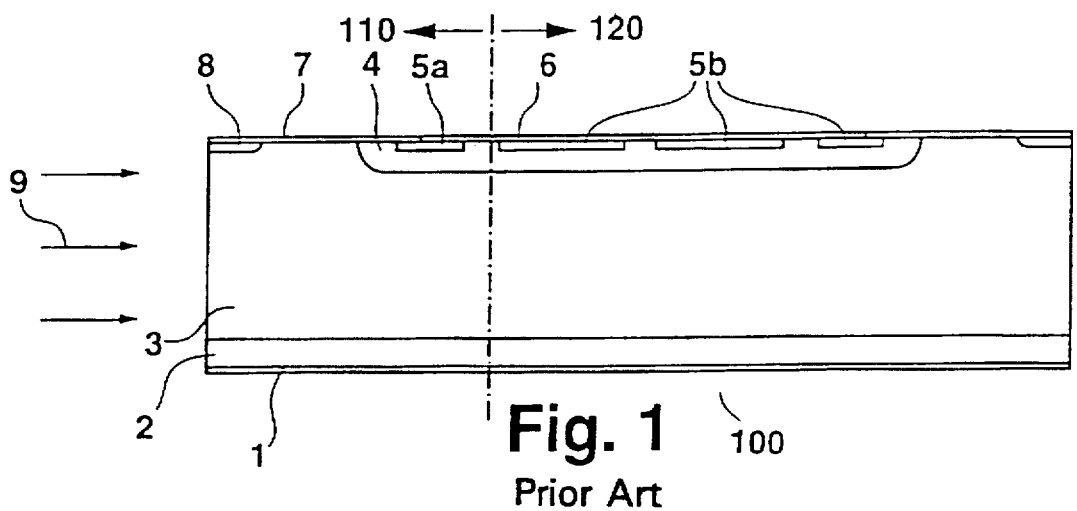
FIG. 1 shows a conventional break-over photodiode for lateral illumination.

FIG. 1 shows a conventional break-over photodiode 100, provided for lateral illumination 9 in an edge region 110. Henceforward, the symbols for a break-over photodiode designed as a pnpn thyristor will be used for all figures. Replacing "p" with "n" and "anode" with "cathode," the corresponding description of an npnp thyristor design is obtained.

A p region 2 connected to an anode metal plating 1 is followed by an n⁻region 3, into which a gate 4, configured as a p region, is embedded. An edge emitter 5a is in turn embedded into the edge region 110 of gate 4 as an n region. An internal emitter 5b, consisting of a plurality of adjacent n regions, is embedded into central region 120 of gate 4. Edge emitter 5a, internal emitter 5b, and gate 4 are short-circuited via a cathode metal plating 6. An n⁺region 8 is embedded on the edges facing away from p region 2 of n⁻region 3. The area of break-over photodiode 100 that is not covered by cathode metal plating 6 is sealed with a silicon oxide layer 7. p region 2, n⁻region 3, and gate 4 form a pnp partial transistor, and emitter regions 5a,b, gate 4, and n region 3 form an npn partial transistor. This is the conventional design of a pnpn thyristor, which switches through from a break-over voltage applied between anode metal plating 1 and cathode metal plating 6 in the direction of flow. Alternatively, break-over photodiode 100 can also be triggered under this break-over voltage by lateral light incidence 9. n⁺region 8 serves as a "channel stop." It limits a space charge region formed before break-over photodiode 100 switches through and thus suppresses surface effects. Silicon oxide layer 7 serves as a protection and electrical insulation. The short circuit between edge emitter 5a, internal emitter 5b, and gate 4 through cathode metal plating 6 reduces the light sensitivity of break-over photodiode 100 to lateral illumination 9 (the minimum required light flux for triggering break-over photodiode 100 below the break-over voltage is set high), but it is required, among other things, that the high sturdiness requirements for break-over photodiode 100 be satisfied with quick voltage changes.

The triggering mechanism of thyristors, configured as break-over photodiodes are discussed in detail below. When a voltage is applied between anode and cathode, the pn junction between gate 4 and n region 3 is blocked. This blockage can be overcome by a build-up of a voltage differential greater than 0.6 V (for silicon at room temperature) between emitter regions 5a,b and gate 4, since then the npn transistor formed by emitter regions 5a,b, gate 4, and n region 3 becomes conducting. Since emitter region 5a,b and gate 4 are short-circuited via the cathode metal plating 6, a sufficient voltage differential can build up between the emitter regions 5a,b and the gate 4 only if a sufficiently high current flows through the p region that forms gate 4. The intensity of the sufficient current depends on the layer resistivity of gate 4 under the emitter region. In edge region 110, an edge-gate-cathode resistivity R_rand is formed basically by the p region located under edge emitter 5a. In the central region 120, a center-gate-cathode resistivity R_mitte is basically formed by the p region located under the internal emitter. The magnitude of these resistivities R_rand and R_mitte define the current required for triggering the break-over photodiode. Since a photoelectric current is generated by illuminating the edge region 110, the resistivity R_rand is critical for triggering the break-over photodiode by illuminating i. The greater the resistivity R_rand, the easier it is to trigger the break-over photodiode by illuminating it. The break-over photodiode can, however, also be triggered without illuminating it if the parasitic currents and/or cut-off currents exceed a certain value. Normally parasitic currents are currents generated as a result of dynamic effects, for example, when a voltage is applied between anode and cathode due to parasitic capacitances or pn junction capacitances. In order to trigger the diode with such currents ("parasitic currents," short for "parasitic and/ or cut-off currents"), it is important to determine whether the diode has an avalanche geometry or a punch-through geometry.

Figure 2:
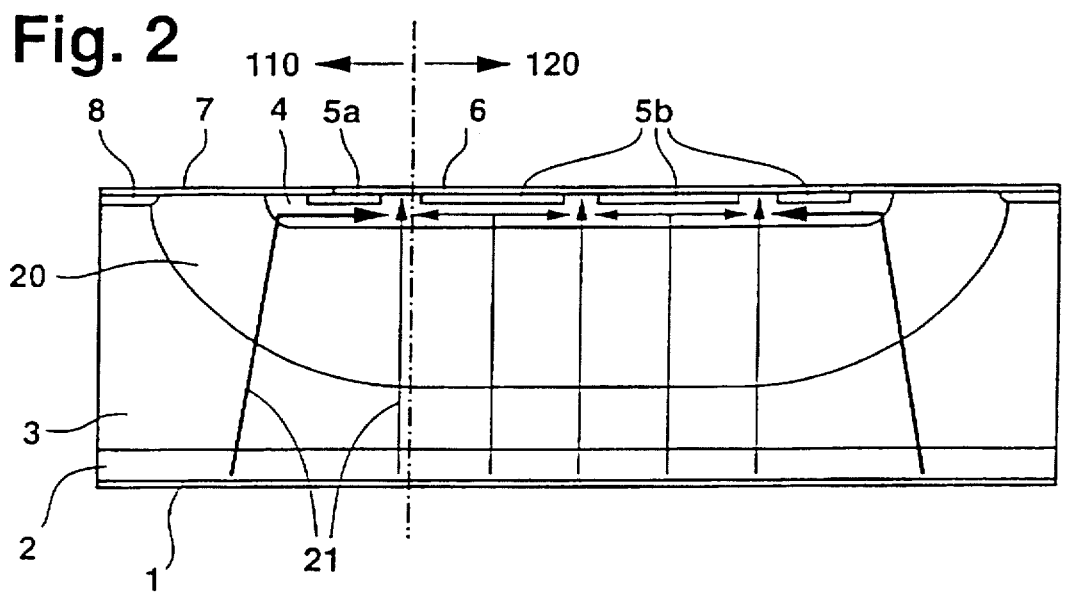
FIG. 2 shows a break-over photodiode with an avalanche geometry.

FIG. 2 shows a break-over photodiode with an avalanche geometry. This geometry is defined by the fact that break-over of the diode occurs through the avalanche effect, i.e., due to high field intensities. Such high field intensities arise at the high curvatures of space charge region 20 located in edge zone 110 for the geometry illustrated in FIG. 2. Therefore, the parasitic currents flow predominantly in edge zone 110 as illustrated in FIG. 2 through current paths 21. Therefore, in order to trigger this diode by parasitic currents, resistivity R_rand is also critical, since an increase in R_rand (which is required for high light sensitivity) also results in an increase in the sensitivity to triggering by parasitic currents. Thus, a high sensitivity to light coupled with a high degree of safety against undesired switching due to parasitic currents is difficult to achieve in such break-over photodiodes.

Figure 3:
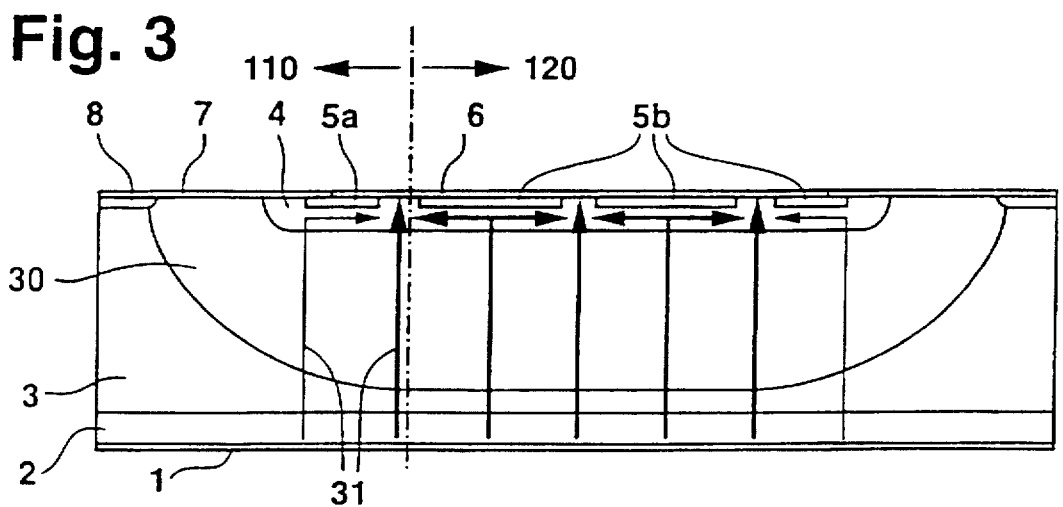
FIG. 3 shows a break-over photodiode with a punch-through geometry.

FIG. 3 shows the case of a break-over photodiode with punch-through geometry, where, contrary to the avalanche geometry, the difference in current amplification of the pnp partial transistor between the edge and central zones is significant. A space charge region 30 approaches p region 2 shortly before switching so that an effective base width, given by the distance of space charge region 30 from p region 2, becomes extremely small. For this to occur, n region 3 must be sufficiently thin. This results in high current amplification even of the currents flowing prior to switching in the central zone of the break-over photodiode. Therefore, despite the high field intensities in the curved area of space charge region 30, most of the parasitic currents flow along current paths 31, which are concentrated in central zone 120 of the break-over photodiode. If the voltage applied between anode and cathode metal plating 1 and 6, respectively (without illumination) is increased until it reaches the "break-over voltage," the voltage that drops at the layer resistivity of gate 4 (described with the explanation to FIG. 1) reaches a certain value (for silicon approximately 0.6 V at room temperature), which results in the break-over photodiode switching through. In the punch-through geometry described above, this voltage drop is first achieved through the currents flowing before switching-through takes place in central area 120 of break-over photodiode 100. Triggering in punch-through geometry through parasitic currents is therefore determined by R_mitte, as long as the difference between R_rand and R_mitte is not so great that the low intensity of the parasitic currents on the edge is overcompensated for by a very large resistivity R_rand.

Lateral illumination 9 produces charge carriers, which become insulated in the space charge region of edge zone 110. In such case, holes flow to gate 4 and form a current that causes a voltage drop at the layer resistivity of gate 4 in edge zone 110. The punch-through geometry allows reaching a certain voltage drop at gate 4 to be set separately as a condition for the break-over photodiode to switch through, triggered by illumination below the break-over voltage, as well as for switching through to occur as a result of the break-over voltage being reached (without illumination). Also measures other than the use of punch-through geometry are conceivable, of course, which prevent intense parasitic currents from flowing in the edge zone.

R_rand is critical for triggering as a result of lateral illumination 9 below the break-over voltage, since the light-induced current, which is to deliver the voltage drop required for break-over at the R_rand (e.g., 0.6 V for silicon at room temperature) only flows in the edge zone (110). The edge zone (110) can have a symmetrical design, so that the break-over photodiode can be illuminated laterally from either side.

On the other hand, current paths 31 of the currents that flow even without illumination prior to reaching the break-over voltage are concentrated in central area 120. They are responsible for the voltage drop required for break-over at R_mitte. If this voltage drop reaches 0.6 V (for silicon at room temperature), the voltage applied between cathode metal plating (1) and anode metal plating (6) has reached the break-over voltage value and the break-over photodiode switches through.

Figure 4:
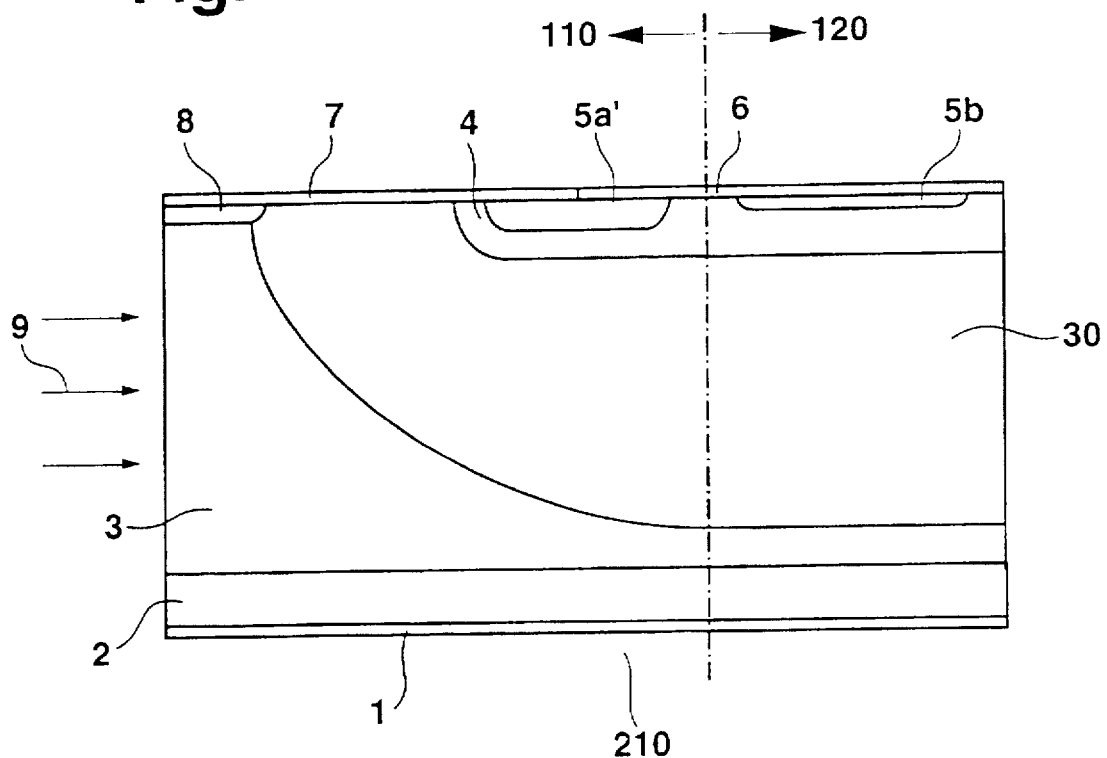
FIG. 4 shows a first embodiment according to the present invention.

FIG. 4 shows a first embodiment 210 of a break-over photodiode 100 according to the present invention with thick edge emitter 5a'. Edge emitter 5a' in edge zone 110, which is thick compared to the internal emitter 5b in the central area 120, ensures high layer resistivity of gate 4, and thus a high R_rand, in the edge zone where charge carriers are produced through lateral illumination 9, due to the small cross section in the lateral direction under edge emitter 5a'. Thus, the minimum light flux required for reaching the triggering condition (a voltage drop of, for example, 0.6 V for silicon at room temperature) is reduced.

Figure 5:
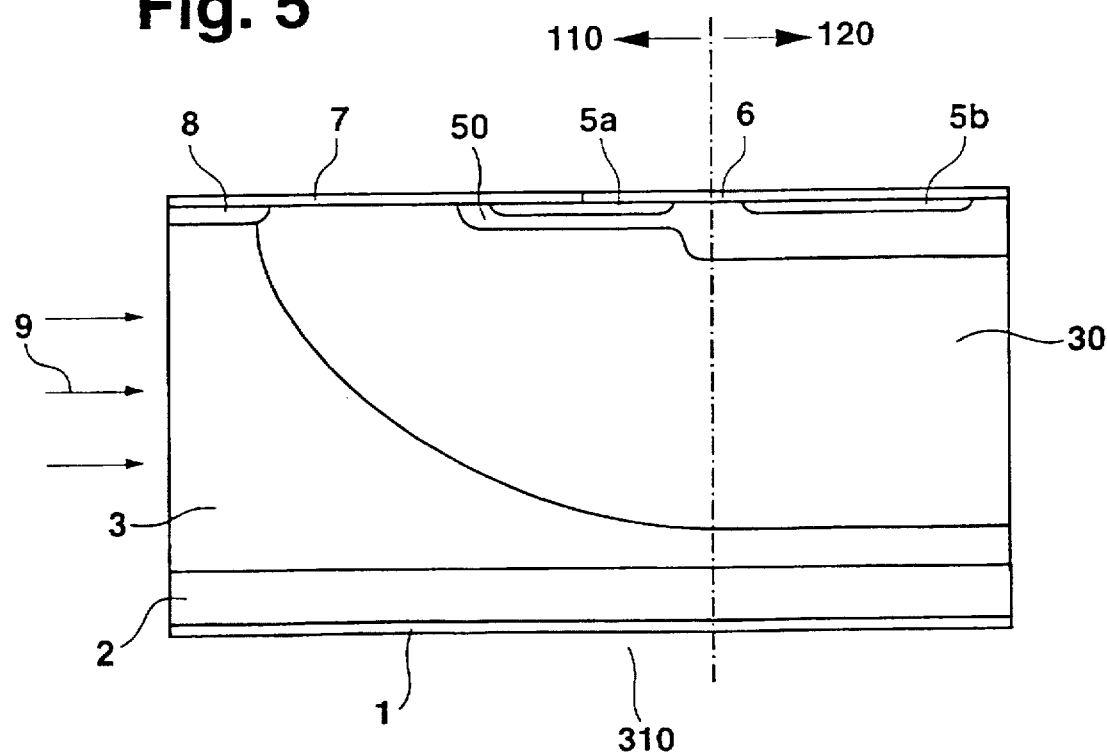
FIG. 5 shows a second embodiment according to the present invention.

FIG. 5 shows a second embodiment 310 of break-over photodiode 100 according to the present invention with a gate 50, which is thinner in edge zone 110 than in central zone 120. As in the case of first embodiment 210, here as well the layer resistivity of the gate in the edge zone and R_rand is greater than in the central area before the break-over photodiode switches through. Also in this case, increased light sensitivity is obtained to lateral illumination. If a break-over of break-over photodiode 210 or 310 occurs without illumination in the central area 120, in order to ensure a high break-over current, R_rand must also be selected so that the triggering condition (voltage drop of approx. 0.6 V for silicon at room temperature) is not attained in edge zone 110 of gate 4 first due to the currents flowing before break-over photodiode 210 or 310 switches through, despite the greater current amplification of the pnp partial transistor in central area 120. Thus, the diodes shown in FIGS. 4 and 5, which otherwise have punch-through geometry or other means limiting a considerable portion of the parasitic currents to the central zone, can be triggered with a low light flux and are well-protected from unintended triggering, since parasitic currents flow mainly in the central area.

In embodiments of the photodiodes 210 and 310 according to the present invention, an increased edge-gate-cathode resistivity R—rand can optionally be achieved by a suitable doping profile of gate 4 in the edge and central zones. A combination of a suitable choice of emitter thickness, gate thickness, and doping profile in the edge and central zones is also conceivable.

What is claimed is:

1. A break-over photodiode having an edge zone and a central zone, the break-over photodiode comprising:

an anode metal plating;

a p-region area connected to the anode metal plating;

at least one $n^-$-region area following the p-region area;

a p-region gate embedded in the $n^-$region area and having a first gate resistivity area and a second gate resistivity area;

a cathode metal plating;

an edge emitter formed by an adjacent plurality of the at least one $n^-$-region area in the edge zone positioned above the first gate resistivity area;

an internal emitter formed by the adjacent plurality of the at least one $n^-$region area in a central zone above the second gate resistivity area, the edge and internal emitters being embedded in the p-region gate, the edge emitter, the internal emitter and the p-region gate being short-circuited using the cathode metal plating;

an edge-gate-cathode resistivity area having a first edge resistivity and provided between the at least one $n^-$-region area and the edge emitter, the first edge resistivity determined by a first gate resistivity of the first gate resistivity area; and a center-gate-cathode resistivity area having a second center resistivity and provided between the $n^-$-region area and the internal emitter, the second center resistivity determined by a second gate resistivity of the second gate resistivity area, the first edge resistivity being greater than the second center resistivity;

wherein the break-over photodiode is stackable with a second break-over photodiode by serially connecting the break-over photodiode to the second break-over photodiode for representing a high-voltage break-over diode, and wherein the break-over photodiode is triggerable using a lateral illumination at the edge zone.

2. The break-over photodiode according to claim 1, wherein the p-region gate, the $n^-$-region area and the p-region area form a pnp partial transistor, the $n^-$-region forming a base with an effective base width of the pnp partial transistor, the $n^-$-region area being thin to form a space charge region in the $n^-$-region area before a break-over approaches the p-region area, the space charge region being formed when a predetermined voltage is applied between the cathode metal plating and the anode metal plating in a direction of a current, wherein the effective base width of the pnp partial transistor is smaller in the central zone than in the edge zone, the effective base width determined by a distance between the space charge region and the p-region area, the pnp partial transistor having a current amplification being greater in the central zone than in the edge zone, and wherein the current flowing in the central region has a current density greater in the central zone than in the edge zone when the voltage is applied in the direction of the current between cathode metal plating and anode metal plating, the voltage being applied without the lateral illumination and before the break-over.

3. The break-over photodiode according to claim 2, wherein the first edge resistivity is selected to obtain the break-over of the break-over photodiode without illuminating the break-over photodiode in the central zone.

4. The break-over photodiode according to claim 1, wherein the first edge resistivity is generated to be greater than the second center resistivity by at least one of providing a thicker edge emitter width of the edge emitter than an internal emitter width of the internal emitter and providing different doping profiles of the edge and internal emitters, the p-region gate having a location-independent design.

5. The break-over photodiode according to claim 1, wherein the first edge resistivity is generated to be greater than the second center resistivity by at least one of providing the p-region gate to be thinner in the edge zone than in the central zone and providing the p-region gate with different doping profiles in the edge zone and the central zone, the emitter zone having a location-independent design.

6. A break-over photodiode having an edge zone and a central zone, the break-over photodiode comprising:

a cathode metal plating;

an n-region area connected to the cathode metal plating;

at least one $p^-$-region area following the n-region area;

an n-region gate embedded in the $p^-$-region area and having a first gate resistivity area and a second gate resistivity area;

an anode metal plating;

an edge emitter formed by an adjacent plurality of the at least one $p^-$-region area in the edge zone positioned above the first gate resistivity area;

an internal emitter formed by the adjacent plurality of the at least one $p^-$-region area in a central zone above the second gate resistivity area, the edge and internal emitters being embedded in the n-region gate, the edge emitter, the internal emitter and the n-region gate being short-circuited using the anode metal plating;

an edge-gate-cathode resistivity area having a first edge resistivity and provided between the $p^-$-region area and the edge emitter, the first edge resistivity determined by a first gate resistivity of the first gate resistivity area; and a center-gate-cathode resistivity area having a second center resistivity and provided between the $p^-$-region area and the internal emitter, the second center resistivity determined by a second gate resistivity of the second gate resistivity area, the first edge resistivity being greater than the second center resistivity;

wherein the break-over photodiode is stackable with a second break-over photodiode to represent a high-voltage break-over diode, and wherein the break-over photodiode is triggerable using a lateral illumination at the edge zone.

7. The break-over photodiode according to claim 6, wherein the n-region gate, the $p^-$-region area and the n-region area form an npn partial transistor, the $p^-$-region area forming a base with an effective base width of the npn partial transistor, the $p^-$-region area being thin to form a space charge region in the $p^-$-region area before a break-over approaches the n-region area, the space charge region being formed when a predetermined voltage is applied between the cathode metal plating and the anode metal plating in a direction of a current, wherein the effective base width of the npn partial transistor is smaller in the central zone than in the edge zone, the effective base width determined by a distance between the space charge region and the n-region area, the npn partial transistor having a current amplification being greater in the central zone than in the edge zone, and wherein the current flowing in the central region has a current density greater in the central zone than in the edge zone when the voltage is applied in the direction of the current between the cathode metal plating and the anode metal plating, the voltage being applied without the lateral illumination and before the break-over.

8. The break-over photodiode according to claim 7, wherein the first edge resistivity is selected to obtain the break-over of the break-over photodiode without illuminating the break-over photodiode in the central zone.

9. The break-over photodiode according to claim 6, wherein the first edge resistivity is generated to be greater than the second center resistivity by at least one of providing a thicker edge emitter width of the edge emitter than an internal emitter width of the internal emitter and providing different doping profiles of the edge and internal emitters, the n-region gate having a location-independent design.

10. The break-over photodiode according to claims 6, wherein the first edge resistivity is generated to be greater than the second center resistivity by at least one of providing the p-region gate to be thinner in the edge zone than in the central zone and providing the p-region gate with different doping profiles in the edge zone and the central zone, the emitter zone having a location-independent design.

* * * * *